US008629541B2

(12) United States Patent
Ou et al.

(10) Patent No.: US 8,629,541 B2
(45) Date of Patent: Jan. 14, 2014

(54) SEMICONDUCTOR PACKAGE FOR CONTROLLING WARPAGE

(75) Inventors: Min-Shin Ou, Kaohsiung (TW); Chun-Yang Lee, Kaohsiung (TW); Jun Zhai, San Jose, CA (US)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 244 days.

(21) Appl. No.: 13/096,618

(22) Filed: Apr. 28, 2011

(65) Prior Publication Data

US 2012/0056336 A1  Mar. 8, 2012

(30) Foreign Application Priority Data

Sep. 3, 2010 (TW) .............................. 99129895 A

(51) Int. Cl.
*H01L 23/02* (2006.01)

(52) U.S. Cl.
USPC ...... 257/678; 257/686; 257/706; 257/E23.01; 438/26; 438/51; 438/55; 438/121

(58) Field of Classification Search
USPC ................... 257/686, 706, 720, 778, E23.01; 438/26, 51, 55, 121, 455; 428/26, 51, 428/55, 121, 455
See application file for complete search history.

(56) References Cited

U.S. PATENT DOCUMENTS

2005/0280139 A1* 12/2005 Zhao et al. .................... 257/704
2007/0176277 A1*  8/2007 Brunnbauer et al. ......... 257/686

* cited by examiner

*Primary Examiner* — Mark A Laurenzi
(74) *Attorney, Agent, or Firm* — Klein, O'Neill & Singh, LLP

(57) ABSTRACT

A semiconductor structure having a ring. The semiconductor structure includes a substrate, at least one chip, and the ring. The substrate has a first surface. The chip is located on the first surface of the substrate and electrically connected to the substrate. The ring has a first portion and a second portion. In various embodiments, the first and second portions different coefficients of thermal expansion (CTE), and or different cross-sectional widths. In another embodiment, the ring includes a third portion having a CTE different from both the first and second CTEs.

19 Claims, 5 Drawing Sheets

SEMICONDUCTOR PACKAGE FOR CONTROLLING WARPAGE

CROSS-REFERENCE TO RELATED APPLICATIONS

This application claims the benefit of priority from Taiwan Patent Application No. 99129895, filed on Sep. 3, 2010, the entire contents of which are hereby incorporated by reference.

TECHNICAL FIELD

The present disclosure relates to semiconductors and more particularly to semiconductor assembly and packaging.

BACKGROUND

One conventional semiconductor structure includes a substrate and at least one chip or die. The chip is located on the upper surface of the substrate and electrically connected to the substrate. The substrate is an organic substrate and includes at least one metal layer and at least one dielectric layer. Typically, the coefficient of thermal expansion (CTE) of the metal layer is different from that of the dielectric layer. Hence, the substrate is subject to warpage after the substrate is heated and then cooled. Placing a metal ring on the upper surface of the substrate can confine the deformation of the substrate to thereby reduce or prevent warpage.

However, the conventional semiconductor structure with the metal ring has shortcomings. When the metal ring is made of aluminum (Al), the warpage of the substrate can be effectively reduced. However, the CTE of aluminum is rather large, and the deformation degree of aluminum is relatively high, thus potentially leading to delamination of the metal ring from the substrate. By contrast, when the metal ring is made of copper (Cu), the CTE of copper is rather small, and the deformation degree of copper is relatively low. As such, delamination is less likely to occur between the copper ring and the substrate. Nevertheless, the substrate is still subject to warpage, and so is the metal ring.

A solution to the foregoing warpage issues would be of great benefit to the semiconductor industry and its customers.

SUMMARY

The present embodiments provide a semiconductor structure that has a ring. Specifically, the semiconductor structure includes a substrate, at least one chip, and the ring. The substrate has a first surface. The chip is located on the first surface of the substrate and electrically connected to the substrate. The ring has a first portion and a second portion. The first portion of the ring is located on the first surface of the substrate and has a first coefficient of thermal expansion (CTE). The second portion of the ring is located on the first portion of the ring. The second portion of the ring has a second CTE, and the second CTE is greater than the first CTE.

The present embodiments further provide a semiconductor structure that has a ring. Specifically, the semiconductor structure includes a substrate, at least one chip, and the ring. The substrate has a first surface. The chip is located on the first surface of the substrate and electrically connected to the substrate. The ring has a first portion and a second portion. In one embodiment, the first portion of the ring is located on the first surface of the substrate, the second portion is located on the first portion of the ring, and a cross-sectional width of the first portion is less than a cross-sectional width of the second portion.

The present embodiments advantageously reduce the likelihood of warpage of the substrate, so that the yield rate is increased and overall manufacturing costs are reduced.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
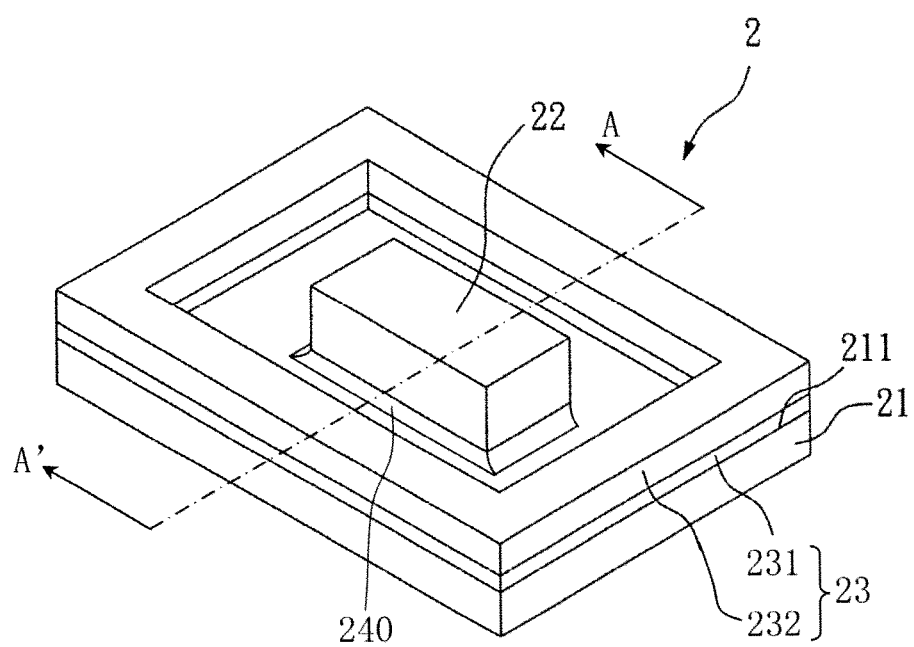
FIG. 1 is a perspective view showing a semiconductor package according to one embodiment.
Figure 2A:
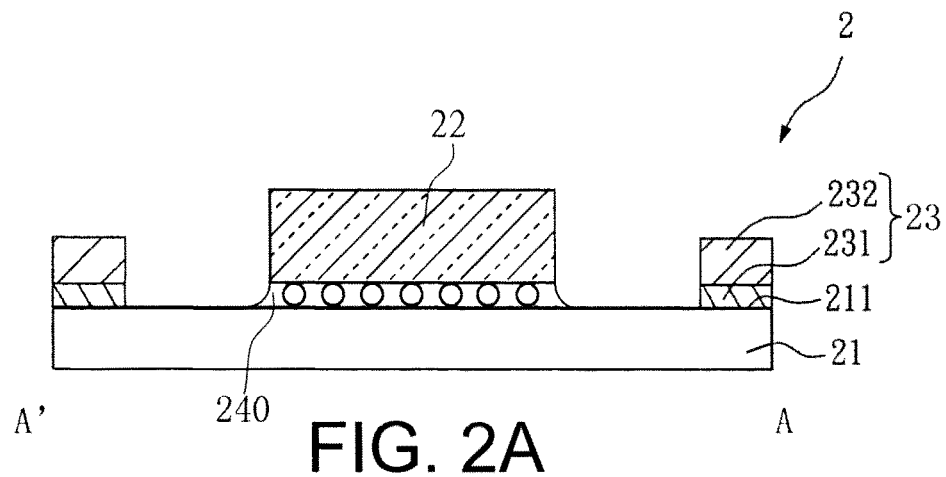
FIGS. 2A-2C are cross-sectional views of the structure in FIG. 1 along cut line A-A'.
Figure 2B:
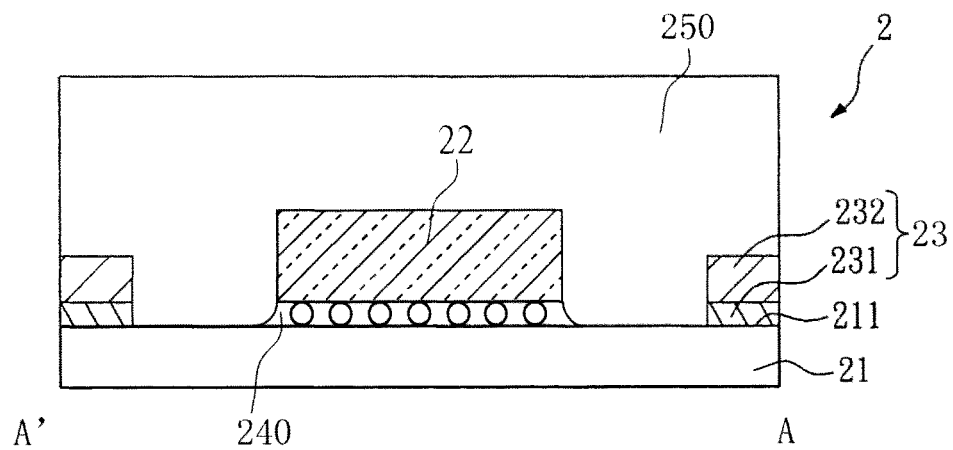
Figure 2C:
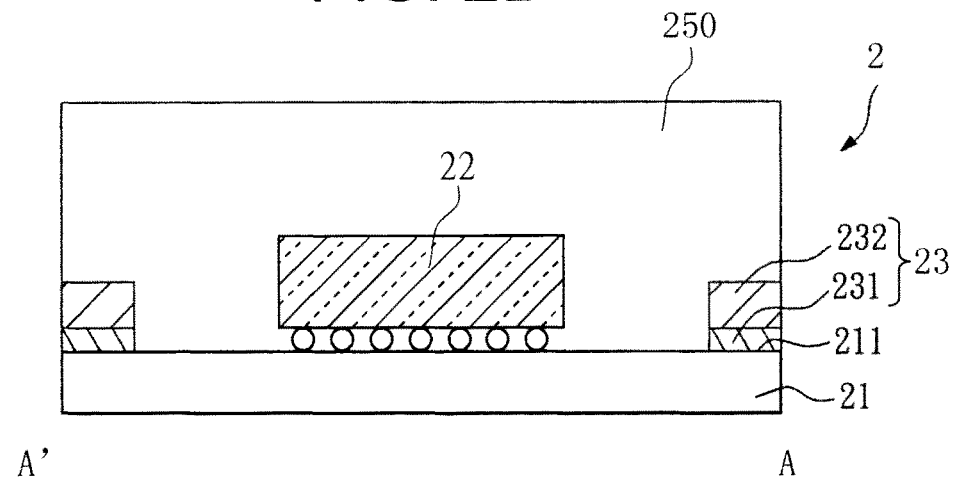

Referring to FIG. 1 and FIGS. 2A-2C, FIG. 1 is a perspective view showing a semiconductor package structure 2 according to one embodiment, and FIGS. 2A-2C are cross-sectional views of the structure 2 in FIG. 1 along cut line A-A'. Specifically, the semiconductor package structure 2 includes a substrate 21, at least one chip 22, and a metal ring 23. The substrate 21 has a first surface 211. The chip 22 is located on the first surface 211 of the substrate 21 and electrically connected to the substrate 21. In this embodiment, the substrate 21 is an organic substrate, and the chip 22 is configured on the first surface 211 of the substrate 21 through flip-chip bonding.

With reference to FIG. 2A, in one embodiment an underfill material 240 occupies the spaces between the chip 22 and the substrate 21 for protecting the bonding structure. With reference to FIG. 2B, in another embodiment a molding compound 250 covers the chip 22 and the underfill material 240. With reference to FIG. 2C, in another embodiment the molding compound 250 covers the chip 22 and occupies the spaces between the chip 22 and the substrate 21 as shown in FIG. 2C.

The metal ring 23 has a first portion 231 and a second portion 232 and surrounds the chip 22. The first portion 231 is located on the first surface 211 of the substrate 21 and has a first CTE. The second portion 232 is located on the first portion 231, spaced from the first surface 211 of the substrate 21. The material of the second portion 232 is different from that of the first portion 231. The second portion 232 thus has a second CTE, and the second CTE is different from the first CTE. In one embodiment, the second CTE is greater than the first CTE. For example, the first portion 231 may be made of copper, and the second portion 232 may be made of aluminum.

With reference to FIGS. 2A-2C, the thickness of the metal ring 23 is less than the thickness of the chip 22. However, in other embodiments the relative thicknesses of the metal ring 23 and the chip 22 could be reversed, or equal. The first portion 231 is secured to the first surface 211 of the substrate 21, as with a first adhesive (not shown), and the second portion 232 is secured to the first portion 231, as with a second adhesive (not shown).

The deformation degree of the substrate 21 is subject to the first portion 231, and the deformation degree of the first portion 231 is subject to the second portion 232, so as to reduce the likelihood of warpage of the substrate 21. In addition, the first CTE of the first portion 231 is less than the second CTE of the second portion 232. Namely, the deformation degree of the first portion 231 is higher than the deformation degree of the second portion 232. As such, delamination is less likely to occur between the first portion 231 and the substrate 21.

Figure 3:
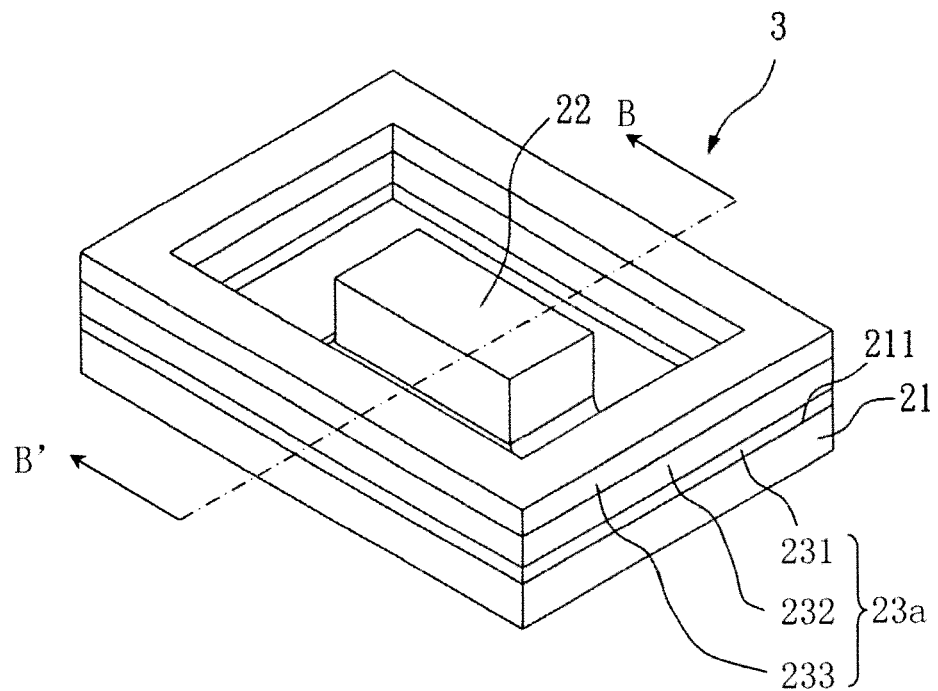
FIG. 3 is a perspective view showing a semiconductor package according to another embodiment.
Figure 4:
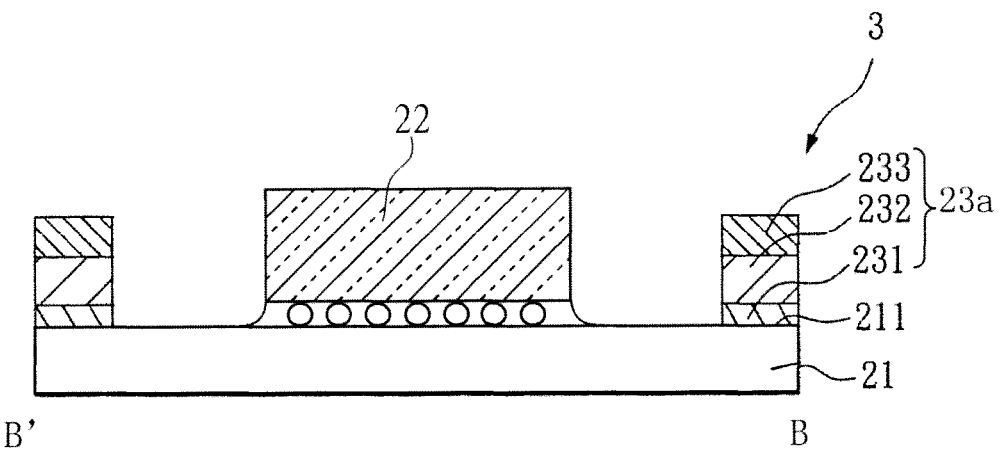
FIG. 4 is a cross-sectional view of the structure in FIG. 3 along cut line B-B'.

Referring to FIGS. 3 and 4, FIG. 3 is a perspective view showing a semiconductor package according to another embodiment, and FIG. 4 is a cross-sectional view of the structure in FIG. 3 along cut line B-B'. The semiconductor structure 3 having a metal ring 23a as described in this embodiment is approximately the same as the semiconductor structure 2 having the metal ring 23 as described in the above embodiment and shown in FIG. 1 and FIGS. 2A-2C. Therefore, same components in FIG. 1, FIG. 2A, FIG. 3, and FIG. 4 are denoted by the same reference numerals. The difference between this embodiment and the above embodiment lies in that the metal ring 23a of the semiconductor structure 3 further includes a third portion 233. The third portion 233 of this embodiment is located on the second portion 232, and spaced from both the first portion 231 and the substrate 21. The material of the third portion 233 is different from that of the first portion 231 and that of the second portion 232. Thus, the third portion 233 has a third CTE, which is different from that of the first portion 231 and that of the second portion 232. In one embodiment, the third CTE is greater than the second CTE, which is greater than the first CTE. Accordingly, the semiconductor structure 3 having the metal ring 23a as described in this embodiment further reduces the likelihood of the substrate 21 becoming warped.

Figure 5:
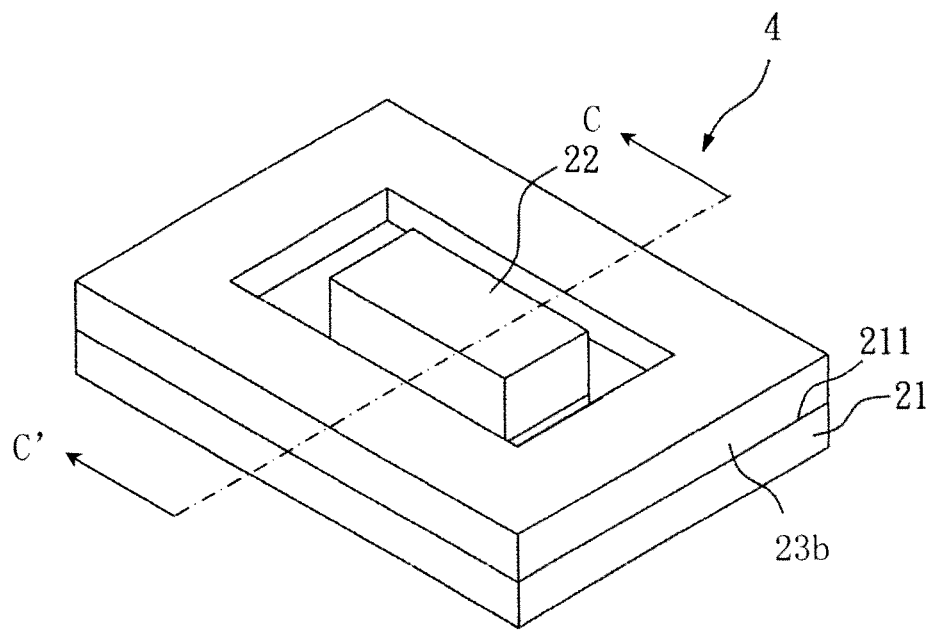
FIG. 5 is a perspective view showing a semiconductor package according to another embodiment.
Figure 6:
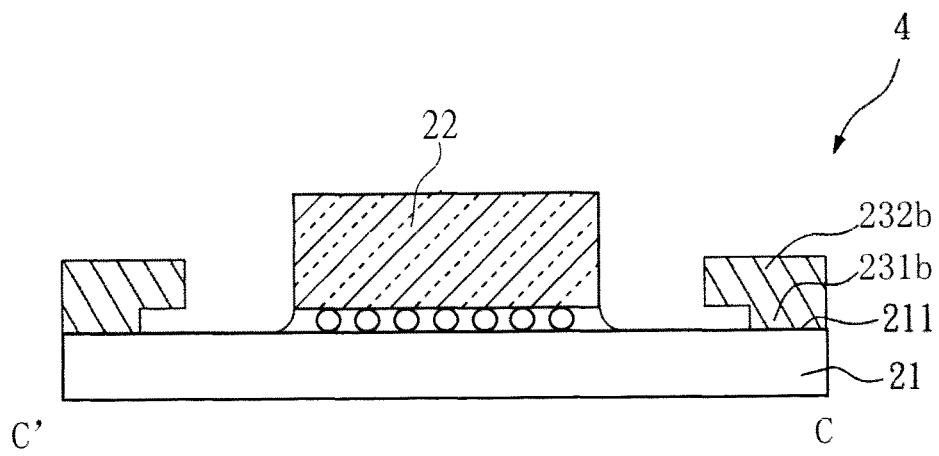
FIG. 6 is a cross-sectional view of the structure in FIG. 5 along cut line C-C'.

Referring to FIGS. 5 and 6, FIG. 5 is a perspective view showing a semiconductor package according to another embodiment, and FIG. 6 is a cross-sectional view of the structure in FIG. 5 along cut line C-C'. Specifically, the semiconductor structure 4 includes a substrate 21, at least one chip 22, and a metal ring 23b. The substrate 21 has a first surface 211. The chip 22 is located on the first surface 211 of the substrate 21 and electrically connected to the substrate 21. In this embodiment, the substrate 21 is an organic substrate, and the chip 22 is configured on the first surface 211 of the substrate 21 through flip-chip bonding. The metal ring 23b has a first portion 231b and a second portion 232b. The first portion 231b abuts the first surface 211 of the substrate 21. The second portion 232b is integrally formed with the first portion 231 and spaced from the substrate 21. A cross-sectional width of the first portion 231 is less than a width of the second portion 232. Thus, a cross-sectional shape of the metal ring 23b is an inverted L, with a flange extending inwardly toward the chip 22 and spaced from the substrate 21.

The deformation of the substrate 21 is confined to the metal ring 23, so as to reduce the likelihood of warpage of the substrate 21. In addition, since the width of the first portion 231 is less than the width of the second portion 232, the contact area between the metal ring 23 and the first surface 211 of the substrate 21 is reduced. As such, more devices (not shown) can be configured on the first surface 211 of the substrate 21. But, at the same time, the warpage resistance of the substrate 21 benefits from the added strength of the increased width of the second portion 232.

Figure 7:
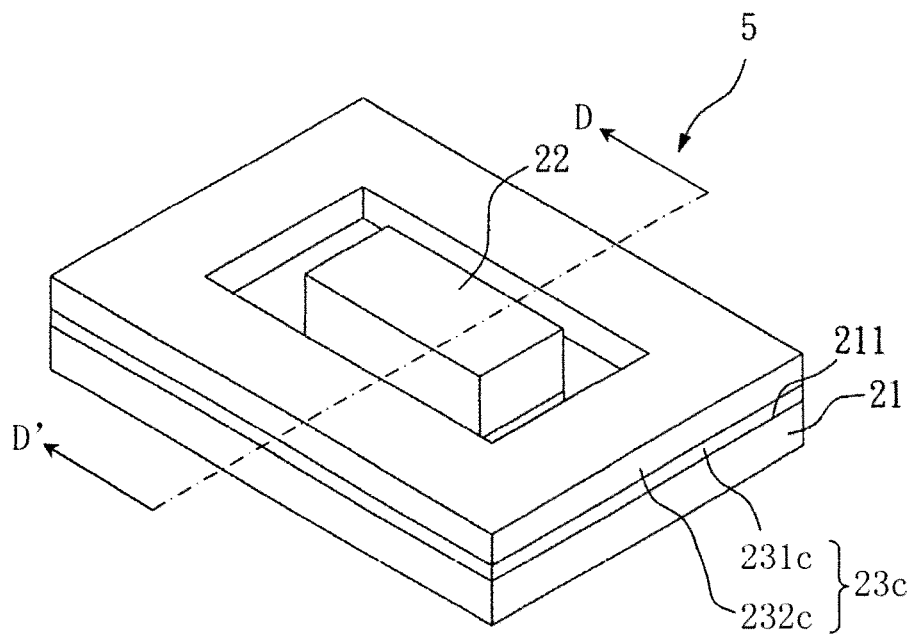
FIG. 7 is a perspective view showing a semiconductor package according to still another embodiment.
Figure 8:
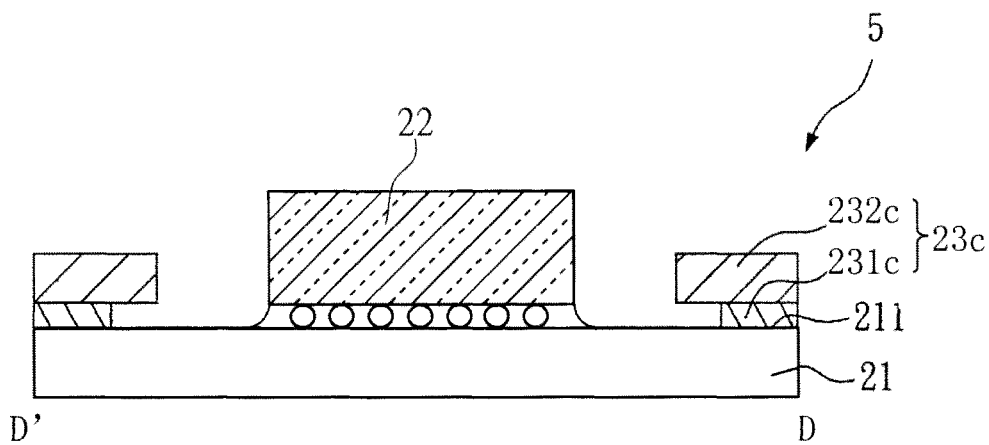
FIG. 8 is a cross-sectional view of the structure in FIG. 7 along cut line D-D'.

Referring to FIGS. 7 and 8. FIG. 7 is a perspective view showing a semiconductor package according to still another embodiment, and FIG. 8 is a cross-sectional view of the structure in FIG. 7 along cut line D-D'. The semiconductor structure 5 having a metal ring 23c as described in this embodiment is approximately the same as the semiconductor structure 4 having the metal ring 23b as described in the aforementioned embodiment shown in FIGS. 5 and 6. Therefore, same components in FIGS. 5-8 are denoted by the same reference numerals. The difference between this embodiment and the above embodiment lies in that the material of the first portion 231c of the metal ring 23c is different from the material of the second portion 232c of the metal ring 23c. The first portion 231c is secured to the first surface 211 of the substrate 21, as with a first adhesive (not shown), and the second portion 232c is secured to the first portion 231, as with a second adhesive (not shown).

In this embodiment, the first portion 231c may be made of copper, and the second portion 232c may be made of aluminum, for example. The first portion 231c thus has a first CTE, the second portion 232c has a second CTE, and the second CTE is greater than the first CTE. Thereby, the semiconductor structure 5 having the metal ring as described in this embodiment further enhances the warp resistance of the substrate 21 in comparison with the semiconductor structure 4 having the metal ring 23b as described in the embodiment of FIGS. 5 and 6.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor structure comprising:
   a substrate having a first surface;
   at least one chip located on the first surface of the substrate and electrically connected to the substrate; and
   a ring having a first portion and a second portion, the first portion being located on the first surface of the substrate and having a first coefficient of thermal expansion, the second portion being located on the first portion and having a second coefficient of thermal expansion, wherein a material of the second portion is different from a material of the first portion, and the second coefficient of thermal expansion is greater than the first coefficient of thermal expansion and a third portion located on the second portion, a material of the third portion is different from the material of the first portion and the material of the second portion, the third portion has a third coefficient of thermal expansion, and the third coefficient of thermal expansion is greater than the second coefficient of thermal expansion.

2. The semiconductor structure as claimed in claim 1, wherein the at least one chip is configured on the first surface of the substrate by flip-chip bonding.

3. The semiconductor structure as claimed in claim 1, wherein the ring surrounds the at least one chip.

4. The semiconductor structure as claimed in claim 1, wherein a thickness of the ring is less than a thickness of the at least one chip.

5. The semiconductor structure as claimed in claim 1, wherein the first portion is adhered to the first surface of the substrate by a first adhesive, and the second portion is adhered to the first portion by a second adhesive.

6. The semiconductor structure as claimed in claim 1, wherein an appearance of the first portion is the same as an appearance of the second portion.

7. The semiconductor structure as claimed in claim 1, wherein a material of the first portion is copper, and a material of the second portion is aluminum.

8. A semiconductor structure comprising:
a substrate having a first surface;
at least one chip located on the first surface of the substrate and electrically connected to the substrate; and
a ring having a first portion and a second portion, the first portion being located on the first surface of the substrate, the second portion being located on the first portion, a width of the first portion being less than a width of the second portion and a third portion located on the second portion, a material of the third portion is different from the material of the first portion and the material of the second portion, the third portion has a third coefficient of thermal expansion, and the third coefficient of thermal expansion is greater than the second coefficient of thermal expansion.

9. The semiconductor structure as claimed in claim 8, wherein the chip is configured on the first surface of the substrate by flip-chip bonding.

10. The semiconductor structure as claimed in claim 8, wherein the ring surrounds the at least one chip.

11. The semiconductor structure as claimed in claim 8, wherein a thickness of the ring is less than a thickness of the at least one chip.

12. The semiconductor structure as claimed in claim 8, wherein a sectional shape of the ring is an inverted L shape.

13. The semiconductor structure as claimed in claim 8, wherein the first portion is adhered to the first surface of the substrate by a first adhesive, and the second portion is adhered to the first portion by a second adhesive.

14. The semiconductor structure as claimed in claim 8, wherein a material of the first portion is the same as a material of the second portion.

15. The semiconductor structure as claimed in claim 8, wherein a material of the first portion is different from a material of the second portion.

16. The semiconductor structure as claimed in claim 15, wherein a material of the first portion is copper, and a material of the second portion is aluminum.

17. The semiconductor structure as claimed in claim 8, wherein the first portion has a first coefficient of thermal expansion, the second portion has a second coefficient of thermal expansion, and the second coefficient of thermal expansion is greater than the first coefficient of thermal expansion.

18. A semiconductor structure having comprising:
a substrate having a first surface;
at least one chip located on the first surface of the substrate and electrically connected to the substrate; and
at least a bar having a first portion and a second portion, wherein the first portion having a first coefficient of thermal expansion is located on the first surface of the substrate and, the second portion having a second coefficient of thermal expansion is located on the first portion, and the second coefficient of thermal expansion is greater than the first coefficient of thermal expansion and a third portion located on the second portion, a material of the third portion is different from the material of the first portion and the material of the second portion, the third portion has a third coefficient of thermal expansion, and the third coefficient of thermal expansion is greater than the second coefficient of thermal expansion.

19. The semiconductor structure as claimed in claim 18, wherein a shape of the first portion is different from a shape of the second portion.

* * * * *